United States Patent
Ohtani et al.

(10) Patent No.: US 7,837,792 B2
(45) Date of Patent: Nov. 23, 2010

(54) METHOD FOR MANUFACTURING SEMICONDUCTOR DEVICE

(75) Inventors: Hisashi Ohtani, Kanagawa (JP);
Akiharu Miyanaga, Kanagawa (JP);
Satoshi Teramoto, Kanagawa (JP);
Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 475 days.

(21) Appl. No.: 10/946,072

(22) Filed: Sep. 22, 2004

(65) Prior Publication Data

US 2005/0037554 A1 Feb. 17, 2005

Related U.S. Application Data

(63) Continuation of application No. 08/690,747, filed on Aug. 1, 1996, now Pat. No. 6,830,617.

(30) Foreign Application Priority Data

Aug. 2, 1995 (JP) ................. 07-216608

(51) Int. Cl.
*C30B 21/02* (2006.01)
(52) U.S. Cl. ............... 117/95; 117/97; 117/103; 117/923; 117/929
(58) Field of Classification Search ............ 117/95, 117/97, 903, 923, 929
See application file for complete search history.

(56) References Cited

U.S. PATENT DOCUMENTS

| | | |
|---|---|---|
| 3,535,775 A | 10/1970 | Garfinkel et al. |
| 4,371,403 A | 2/1983 | Ikubo et al. |
| 4,409,724 A | 10/1983 | Tasch, Jr. et al. |
| 4,477,308 A | 10/1984 | Gibson et al. |

(Continued)

FOREIGN PATENT DOCUMENTS

EP 0 651 431 5/1995

(Continued)

OTHER PUBLICATIONS

D.J. Llewellyn et al., "Implantation and annealing of Cu in InP for electrical isolation: microstructural characterisation," Optoelectronic and Microelectronic Materials and Devices Proceedings (IEEE 1997), Jan. 1, 1996, pp. 313-316.

(Continued)

*Primary Examiner*—Robert M Kunemund
(74) *Attorney, Agent, or Firm*—Fish & Richardson P.C.

(57) ABSTRACT

In a method for manufacturing a crystalline silicon film by utilizing a metal element that accelerates the crystallization of silicon, an adverse influence of this metal element can be suppressed. A semiconductor device manufacturing method is comprised of the steps of: forming an amorphous silicon film on a substrate having an insulating surface; patterning the amorphous silicon film to form a predetermined pattern; holding a metal element that accelerates the crystallization of silicon in such a manner that the metal element is brought into contact with the amorphous silicon film; performing a heating process to crystalize the amorphous silicon film, thereby being converted into a crystalline silicon film; and etching a peripheral portion of the pattern of the crystalline silicon film.

26 Claims, 10 Drawing Sheets

U.S. PATENT DOCUMENTS

| | | | |
|---|---|---|---|
| 4,529,621 A | 7/1985 | Ballard | |
| 4,534,820 A | 8/1985 | Mori et al. | |
| 5,244,819 A | 9/1993 | Yue | |
| 5,270,264 A | 12/1993 | Andideh et al. | |
| 5,275,896 A | 1/1994 | Garofalo et al. | |
| 5,403,772 A | 4/1995 | Zhang et al. | |
| 5,426,064 A | 6/1995 | Zhang et al. | |
| 5,481,121 A | 1/1996 | Zhang et al. | |
| 5,488,000 A | 1/1996 | Zhang et al. | |
| 5,492,843 A | 2/1996 | Adachi et al. | |
| 5,501,989 A | 3/1996 | Takayama et al. | |
| 5,508,533 A | 4/1996 | Takemura | |
| 5,529,937 A | 6/1996 | Zhang et al. | |
| 5,534,716 A | 7/1996 | Takemura | |
| 5,543,352 A | 8/1996 | Ohtani et al. | |
| 5,550,070 A | 8/1996 | Funai et al. | |
| 5,563,426 A | 10/1996 | Zhang et al. | |
| 5,569,610 A | 10/1996 | Zhang et al. | |
| 5,569,936 A | 10/1996 | Zhang et al. | |
| 5,580,792 A | 12/1996 | Zhang et al. | |
| 5,585,291 A | 12/1996 | Ohtani et al. | |
| 5,589,694 A | 12/1996 | Takayama et al. | |
| 5,595,923 A | 1/1997 | Zhang et al. | |
| 5,595,944 A | 1/1997 | Zhang et al. | |
| 5,604,360 A | 2/1997 | Zhang et al. | |
| 5,605,846 A | 2/1997 | Ohtani et al. | |
| 5,605,847 A | 2/1997 | Zhang | |
| 5,606,179 A | 2/1997 | Yamazaki et al. | |
| 5,608,232 A | 3/1997 | Yamazaki et al. | |
| 5,612,250 A | 3/1997 | Ohtani et al. | |
| 5,614,426 A | 3/1997 | Funada et al. | |
| 5,614,733 A | 3/1997 | Zhang et al. | |
| 5,616,506 A | 4/1997 | Takemura | |
| 5,620,910 A | 4/1997 | Teramoto | |
| 5,621,224 A | 4/1997 | Yamazaki et al. | |
| 5,624,851 A | 4/1997 | Takayama et al. | |
| 5,637,515 A | 6/1997 | Takemura | |
| 5,639,698 A | 6/1997 | Yamazaki et al. | |
| 5,643,826 A | 7/1997 | Ohtani et al. | |
| 5,646,424 A | 7/1997 | Zhang et al. | |
| 5,654,203 A | 8/1997 | Ohtani et al. | |
| 5,656,825 A | 8/1997 | Kusumoto et al. | |
| 5,663,077 A | 9/1997 | Adachi et al. | |
| 5,677,549 A | 10/1997 | Takayama et al. | |
| 5,696,003 A | 12/1997 | Makita et al. | |
| 5,696,386 A | 12/1997 | Yamazaki | |
| 5,696,388 A | 12/1997 | Funada et al. | |
| 5,700,333 A | 12/1997 | Yamazaki et al. | |
| 5,705,829 A | 1/1998 | Miyanaga et al. | |
| 5,712,191 A | 1/1998 | Nakajima et al. | |
| 5,712,203 A | 1/1998 | Hsu | |
| 5,744,824 A | 4/1998 | Kousai et al. | |
| 5,767,530 A | 6/1998 | Ha | |
| 5,773,327 A | 6/1998 | Yamazaki et al. | |
| 5,789,284 A | 8/1998 | Yamazaki et al. | |
| 5,814,540 A | 9/1998 | Takemura et al. | |
| 5,821,562 A | 10/1998 | Makita et al. | |
| 5,840,590 A | 11/1998 | Myers, Jr. et al. | |
| 5,843,225 A | 12/1998 | Takayama et al. | |
| 5,851,860 A | 12/1998 | Makita et al. | |
| 5,869,363 A | 2/1999 | Yamazaki et al. | |
| 5,886,364 A | 3/1999 | Zhang | |
| 5,888,858 A | 3/1999 | Yamazaki et al. | |
| 5,893,730 A | 4/1999 | Yamazaki et al. | |
| 5,897,347 A | 4/1999 | Yamazaki et al. | |
| 5,915,174 A | 6/1999 | Yamazaki et al. | |
| 5,923,962 A | 7/1999 | Ohtani et al. | |
| 5,932,893 A | 8/1999 | Miyanaga et al. | |
| 5,949,115 A | 9/1999 | Yamazaki et al. | |
| 5,956,579 A | 9/1999 | Yamazaki et al. | |
| 5,961,743 A | 10/1999 | Yamazaki et al. | |
| 5,970,327 A | 10/1999 | Makita et al. | |
| 5,977,559 A | 11/1999 | Zhang et al. | |
| 5,985,740 A | 11/1999 | Yamazaki et al. | |
| 6,013,544 A | 1/2000 | Makita et al. | |
| 6,022,458 A | 2/2000 | Ichikawa | |
| 6,027,987 A | 2/2000 | Yamazaki et al. | |
| 6,048,758 A | 4/2000 | Yamazaki et al. | |
| 6,057,557 A | 5/2000 | Ichikawa | |
| 6,063,654 A | 5/2000 | Ohtani | |
| 6,066,518 A | 5/2000 | Yamazaki | |
| 6,071,764 A | 6/2000 | Zhang et al. | |
| 6,071,766 A | 6/2000 | Yamazaki et al. | |
| 6,072,193 A | 6/2000 | Ohnuma et al. | |
| 6,077,731 A | 6/2000 | Yamazaki et al. | |
| 6,077,758 A | 6/2000 | Zhang et al. | |
| 6,083,324 A | 7/2000 | Henley et al. | |
| 6,084,247 A | 7/2000 | Yamazaki et al. | |
| 6,087,679 A | 7/2000 | Yamazaki et al. | |
| 6,093,934 A | 7/2000 | Yamazaki et al. | |
| 6,100,562 A | 8/2000 | Yamazaki et al. | |
| 6,111,557 A | 8/2000 | Koyama et al. | |
| 6,121,660 A | 9/2000 | Yamazaki et al. | |
| 6,133,073 A | 10/2000 | Yamazaki et al. | |
| 6,133,075 A | 10/2000 | Yamazaki et al. | |
| 6,133,119 A | 10/2000 | Yamazaki | |
| 6,153,445 A | 11/2000 | Yamazaki et al. | |
| 6,156,590 A | 12/2000 | Yamazaki et al. | |
| 6,156,628 A | 12/2000 | Ohnuma et al. | |
| 6,157,421 A | 12/2000 | Ishii | |
| 6,160,268 A | 12/2000 | Yamazaki | |
| 6,162,667 A | 12/2000 | Funai et al. | |
| 6,162,704 A | 12/2000 | Yamazaki et al. | |
| 6,165,824 A | 12/2000 | Takano et al. | |
| 6,168,980 B1 | 1/2001 | Yamazaki et al. | |
| 6,180,439 B1 | 1/2001 | Yamazaki et al. | |
| 6,184,559 B1 | 2/2001 | Hayakawa et al. | |
| 6,194,255 B1 | 2/2001 | Hiroki et al. | |
| 6,197,624 B1 | 3/2001 | Yamazaki | |
| 6,201,585 B1 | 3/2001 | Takano et al. | |
| 6,204,101 B1 | 3/2001 | Yamazaki et al. | |
| 6,204,154 B1 | 3/2001 | Zhang et al. | |
| 6,207,969 B1 | 3/2001 | Yamazaki et al. | |
| 6,218,219 B1 | 4/2001 | Yamazaki et al. | |
| 6,225,152 B1 | 5/2001 | Yamazaki et al. | |
| 6,232,205 B1 | 5/2001 | Ohtani | |
| 6,232,621 B1 | 5/2001 | Yamazaki et al. | |
| 6,242,290 B1 | 6/2001 | Nakajima et al. | |
| 6,251,712 B1 | 6/2001 | Tanaka et al. | |
| 6,255,195 B1 | 7/2001 | Linn et al. | |
| 6,285,042 B1 | 9/2001 | Ohtani et al. | |
| 6,287,900 B1 | 9/2001 | Yamazaki et al. | |
| 6,291,275 B1 | 9/2001 | Yamazaki et al. | |
| 6,294,441 B1 | 9/2001 | Yamazaki | |
| 6,300,659 B1 | 10/2001 | Zhang et al. | |
| 6,303,415 B1 | 10/2001 | Yamazaki | |
| 6,303,963 B1 | 10/2001 | Ohtani et al. | |
| 6,306,694 B1 | 10/2001 | Yamazaki et al. | |
| 6,307,214 B1 | 10/2001 | Ohtani et al. | |
| 6,316,789 B1 | 11/2001 | Yamazaki et al. | |
| 6,316,810 B1 | 11/2001 | Yamazaki et al. | |
| 6,319,761 B1 | 11/2001 | Zhang et al. | |
| 6,335,540 B1 | 1/2002 | Zhang | |
| 6,335,541 B1 | 1/2002 | Ohtani et al. | |
| 6,337,259 B1 | 1/2002 | Ueda et al. | |
| 6,355,509 B1 | 3/2002 | Yamazaki | |
| 6,376,336 B1 | 4/2002 | Buynoski | |
| 6,383,852 B2 | 5/2002 | Zhang et al. | |
| 6,391,690 B2 | 5/2002 | Miyasaka | |
| 6,396,147 B1 | 5/2002 | Adachi et al. | |
| 6,426,276 B1 | 7/2002 | Ohnuma et al. | |
| 6,461,943 B1 | 10/2002 | Yamazaki et al. | |
| 6,478,902 B2 | 11/2002 | Koenigsmann et al. | |
| 6,479,333 B1 | 11/2002 | Takano et al. | |

| | | |
|---|---|---|
| 6,518,102 B1 | 2/2003 | Tanaka et al. |
| 6,542,143 B1 | 4/2003 | Ozawa |
| 6,551,907 B2 | 4/2003 | Ohtani |
| 6,555,448 B2 | 4/2003 | Fukushima |
| 6,573,589 B2 | 6/2003 | Zhang |
| 6,592,771 B1 | 7/2003 | Yamanaka et al. |
| 6,599,785 B2 | 7/2003 | Hamada et al. |
| 6,670,259 B1 | 12/2003 | Chan |
| 6,690,068 B2 | 2/2004 | Yamazaki et al. |
| 6,703,265 B2 | 3/2004 | Asami et al. |
| 6,709,955 B2 | 3/2004 | Saggio et al. |
| 6,713,323 B2 | 3/2004 | Yamazaki et al. |
| 6,713,330 B1 | 3/2004 | Zhang et al. |
| 6,756,608 B2 | 6/2004 | Kasahara et al. |
| 6,787,807 B2 | 9/2004 | Yamazaki et al. |
| 6,825,532 B2 | 11/2004 | Linn et al. |
| 6,828,587 B2 | 12/2004 | Yamazaki et al. |
| 6,830,617 B1 | 12/2004 | Ohtani et al. |
| 6,855,580 B2 | 2/2005 | Tanaka et al. |
| 6,858,480 B2 | 2/2005 | Nakamura et al. |
| 2001/0034088 A1 | 10/2001 | Nakamura et al. |
| 2002/0053670 A1 | 5/2002 | Ohtani et al. |
| 2002/0063261 A1 | 5/2002 | Zhang |
| 2002/0094612 A1 | 7/2002 | Nakamura et al. |
| 2002/0098628 A1 | 7/2002 | Hamada et al. |
| 2002/0102764 A1 | 8/2002 | Yamazaki et al. |
| 2002/0102776 A1 | 8/2002 | Yamazaki et al. |
| 2002/0125480 A1 | 9/2002 | Nakamura et al. |
| 2002/0134981 A1 | 9/2002 | Nakamura et al. |
| 2002/0151120 A1 | 10/2002 | Yamazaki et al. |
| 2002/0155652 A1 | 10/2002 | Yamazaki et al. |
| 2002/0182783 A1 | 12/2002 | Takayama et al. |
| 2002/0182785 A1 | 12/2002 | Miyairi |
| 2002/0182828 A1 | 12/2002 | Asami et al. |
| 2002/0197785 A1 | 12/2002 | Yamazaki et al. |
| 2003/0008439 A1 | 1/2003 | Ohnuma |
| 2003/0082859 A1 | 5/2003 | Ichijo et al. |
| 2003/0089911 A1 | 5/2003 | Kasahara et al. |
| 2003/0122129 A1 | 7/2003 | Yamazaki et al. |
| 2004/0180512 A1 | 9/2004 | Linn et al. |
| 2005/0142818 A1 | 6/2005 | Nakamura et al. |

FOREIGN PATENT DOCUMENTS

| | | |
|---|---|---|
| EP | 1 032 027 | 8/2000 |
| EP | 1 158 580 | 11/2001 |
| JP | 57-109322 | 7/1982 |
| JP | 62-169320 | 7/1987 |
| JP | 01-162377 | 6/1989 |
| JP | 04-127437 | 4/1992 |
| JP | 05-109737 | 4/1993 |
| JP | 06-333824 | 12/1994 |
| JP | 06-333825 | 12/1994 |
| JP | 07-130652 | 5/1995 |
| JP | 07-131021 | 5/1995 |
| JP | 07-153689 | 6/1995 |
| JP | 07-176479 | 7/1995 |
| JP | 07-183540 | 7/1995 |
| JP | 08-078329 | 3/1996 |
| JP | 08-330602 | 12/1996 |
| JP | 09-074207 | 3/1997 |
| JP | 11-297703 | 10/1999 |
| JP | 3032801 B2 | 4/2000 |
| JP | 2000-260777 | 9/2000 |
| JP | 2001-210828 | 8/2001 |

OTHER PUBLICATIONS

L. S. Lee et al., "Argon Ion-Implantation on Polysilicon or Amorphous-Silicon for Boron Penetration Suppression in p+ pMOSFET," IEEE Transactions on Electron Devices, Aug. 8, 1998, pp. 1737-1744.

Miyake et al., "Characteristics of Buried-Channel pMOS Devices with Shallow Counter-Doped Layers Fabricated Using Channel Preamorphization," IEEE Transactions on Electron Devices, Mar. 1, 1996, pp. 444-449.

Jones et al., "Boron Diffusion upon Annealing of Laser Thermal Processed Silicon," Ion Implantation Technology 2000 (IEEE 2000), Jul. 2000, pp. 111-114.

Etienne G. Colas et al., "Quantitative Study of Metal Gettering in Silicon," Materials Research Society, vol. 59, 1986, pp. 341-346.

K. Graff et al., "Palladium Test: A Tool to Evaluate Gettering Efficiency," Materials Research Society, vol. 36, 1985, pp. 19-24.

A. Ourmazd, "Lettering of Impurities in Silicon," Materials Research Society, vol. 59, 1986, pp. 331-340.

A. Ourmazd et al., "Gettering of Metallic Impurities in Silicon," Materials Research Society, vol. 36, 1985, pp. 25-30.

550°CSPC          600°CSPC          640°CSPC

METHOD FOR MANUFACTURING SEMICONDUCTOR DEVICE

CROSS-REFERENCE TO RELATED APPLICATIONS

This application is a continuation application of U.S. application Ser. No. 08/690,747 filed Aug. 1, 1996, now U.S. Pat. No. 6,830,617 now allowed, which claims the benefit of a foreign priority application filed in Japan as Serial No. 07-216608 on Aug. 2, 1995. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a method for manufacturing a crystalline silicon thin film, and further to a method for manufacturing a semiconductor device using this crystalline silicon thin film.

2. Description of the Related Art

Conventionally, various techniques are known in this field. That is an amorphous silicon film formed on a glass substrate, or a quartz substrate is crystallized to fabricate a crystalline silicon film, and then, a thin-film transistor is configured by using this crystalline silicon film.

As for a method for forming a crystalline silicon film, typically two manufacturing methods have been proposed. That is, laser light is irradiated to an amorphous silicon film formed by a plasma CVD method and the like so as to convert this amorphous silicon film into a crystalline silicon film. A heating process is carried out to an amorphous silicon film formed by a plasma CVD method and the like, so that this amorphous silicon film is converted into a crystalline silicon film.

As to such a crystalline silicon film forming method, one technique is known from Japanese Laid-open Patent Application No. 6-232059. This technique is used to crystallize the amorphous silicon film under lower temperatures by using the metal elements that accelerates the crystallization of silicon.

The present applicant recognized by their research that when a metal element that accelerates the crystallization of silicon is used to obtain the crystalline silicon film, and further the thin-film transistor is manufactured by using this crystalline silicon film, the dispersion of characteristics of this thin-film transistor tends to occur.

SUMMARY OF THE INVENTION

In the above circumstances, an object of the present invention is to provide a technique for forming a crystalline silicon film by using a metal element that accelerates the crystallization of silicon to prevent the metal element from locally concentrate in this crystalline silicon film.

As a result of extensive study to solve the above problem that the concentration of metal element occurs in the crystalline silicon film, the present applicant could recognize the below-mentioned items.

Figure 2A:
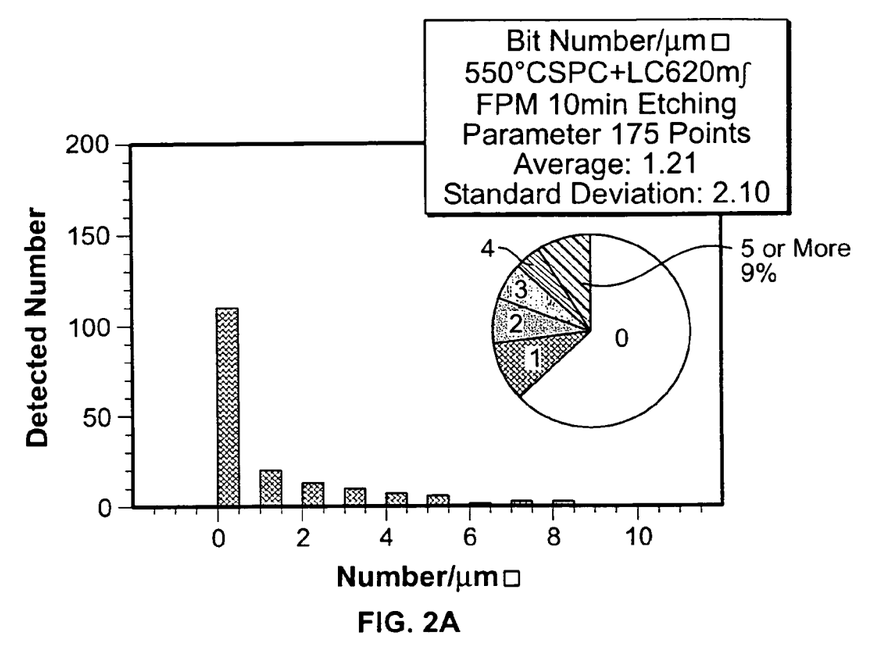
FIG. 2 graphically represents the number of lumps of nickel element contained in a crystalline silicon film per unit area.
Figure 2B:
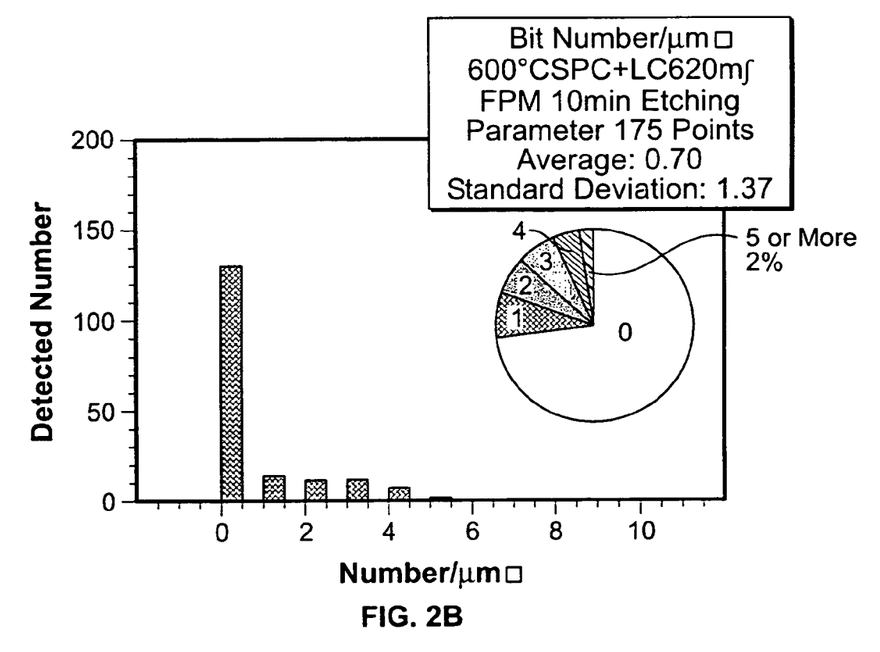
Figure 2C:
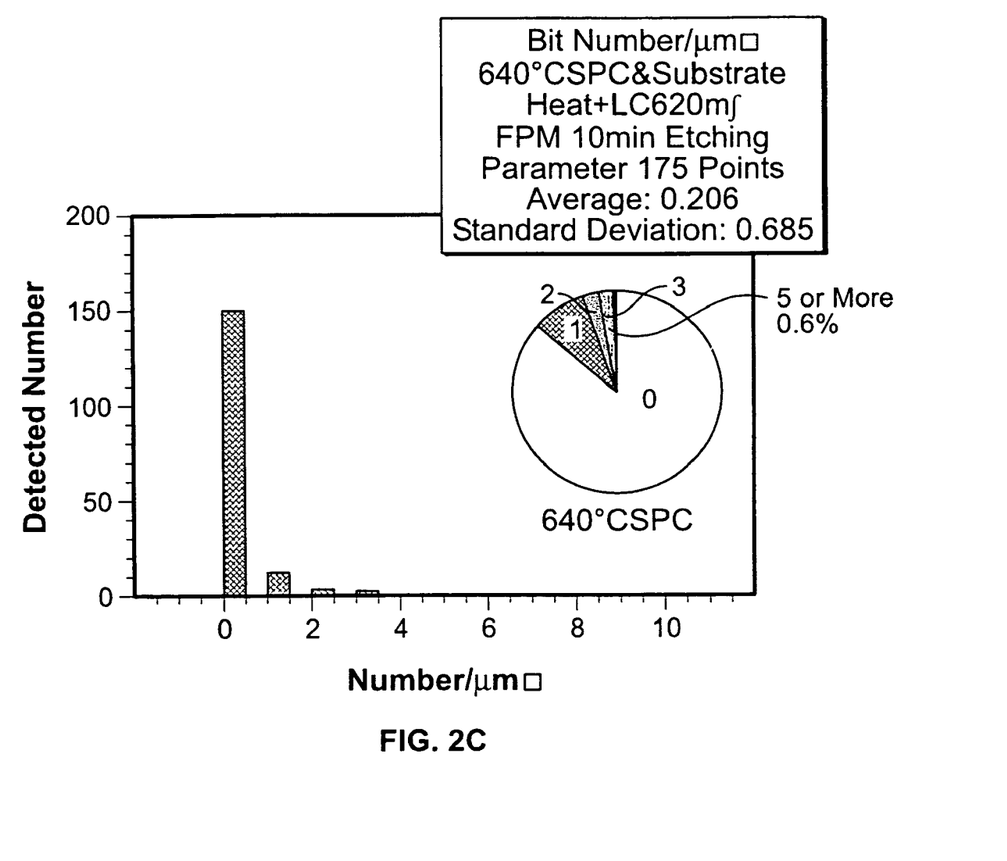

FIG. 2 represents an observation result of a lump of a nickel element in a crystalline silicon film of 1 μm square, which is crystallized by using the nickel element.

A description will now be made of a method for manufacturing the crystalline silicon film from which data indicated in FIG. 2 could be obtained. First, an amorphous silicon film having a thickness of 500 Å is formed on a glass substrate by a plasma CVD method. Then, a nickel acetate solution is coated on the surface of this amorphous silicon film. Under this state, it is realized that the nickel element is made in contact with the surface of the amorphous silicon film. The heating process is carried out for 4 hours at a heating temperature (indicated as SPC temperature in the figure) described in FIG. 2. As a result, a crystalline silicon film formed on the glass substrate can be obtained.

The differences between the samples to obtain three sorts of data shown in FIG. 2 are the heating temperatures to obtain the crystalline silicon film.

The method for observing the lump of nickel element indicated in FIG. 2 is performed in accordance with the following manner. That is the obtained crystalline silicon film is etched away by FPM (mixture solution of fluorine compound and hydrogen peroxide) to remove the region where nickel is lumped (this region is nickel silicide). Then the total number of removed holes is counted by using an electron microscope.

Figure 3:
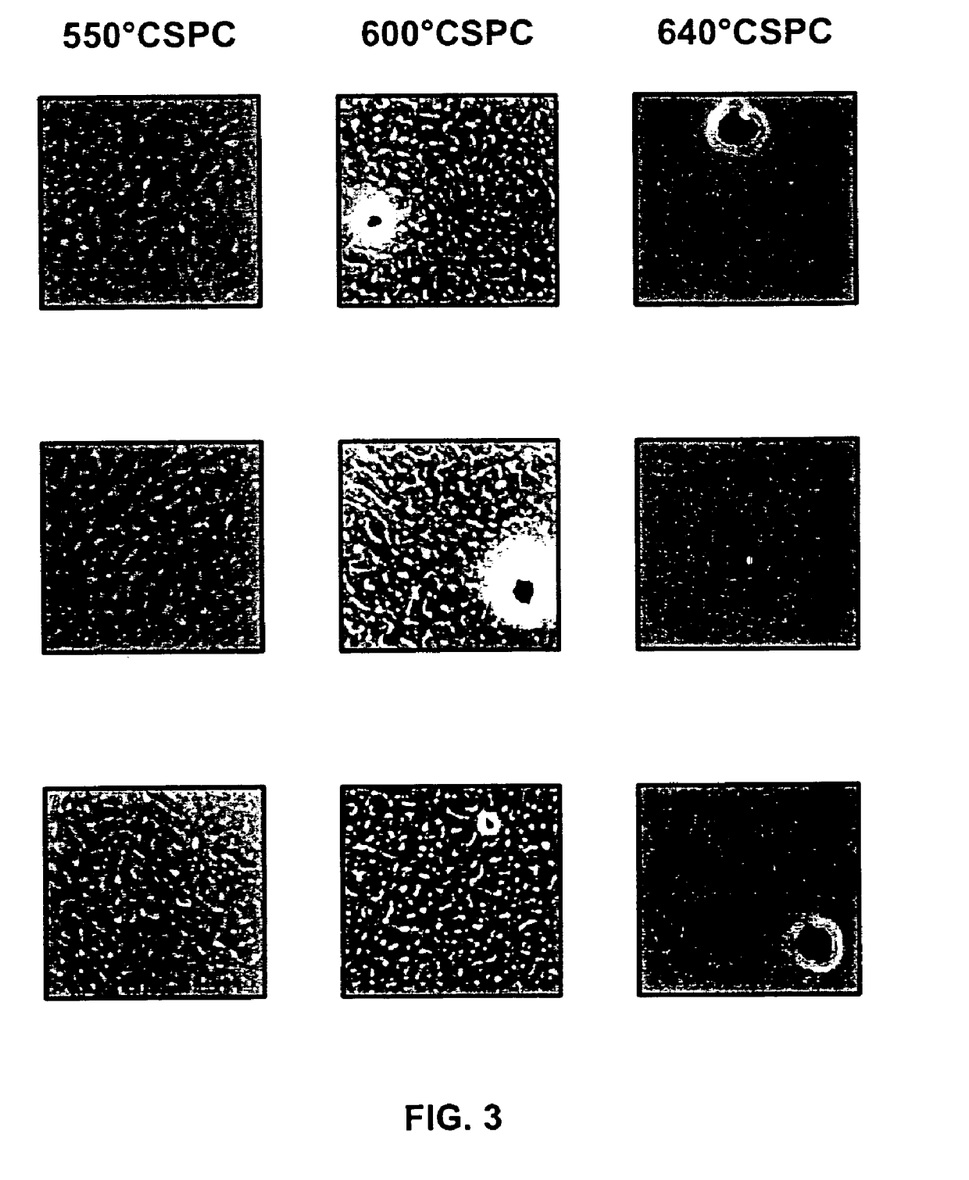
FIG. 3 is a photograph for showing the crystalline silicon film.

In FIG. 3, there are shown conditions of holes indicative of this region where nickel is lumped. That is, FIG. 3 is a photograph showing the state after the surface of the crystalline silicon film has been etched away by FRM, taken by an electron microscope.

Although this observation method could not measure the absolute value of the number of the lumps of nickel element, this observation method could evaluate the relative number.

As indicated in FIG. 2, the higher the temperature of the heating process is increased, the smaller the number of lumps of the detected nickel elements become. However, when the number of the lumps of nickel element is measured by SIMS (secondary ion mass spectroscopy), the concentrations of the nickel elements are substantially equal to each other, irrelevant to the differences in the temperatures at the heating process (during SPC). As a consequence, it is assumed that as to segregation of the nickel element, the higher the temperature at the heating process is increased, the larger each of these lumps becomes.

Also, it is recognized that the higher the temperature at the heating process is increased, the longer the diffusion distance of the nickel element becomes. This diffusion distance "D" may be expressed by approximately $D_o\, t\, \exp(-\Delta E/kT)$. In this formula, symbol "$D_0$" indicates a properly selected constant, symbol "t" denotes a heating time, symbol "$\Delta E$" denotes a properly selected constant, symbol "K" is Boltzmann constant, and symbol "T" represents the heating temperature (SPC temperature). The trend expressed by this formula may be applied not only to the nickel element, but also to other metal elements.

As apparent from the above-described formula, if the heating temperature is increased, then the diffusion distance of the nickel element is increased in the exponential function manner. On the other hand, the higher the heating temperature is increased, the larger the lumps of the nickel element becomes.

Also, as a result of the research made by the Applicant, it could be recognized that the nickel element can be easily concentrated into the region where the stress distortion is concentrated.

The present invention has been accomplished based upon the above-described recognitions, as disclosed in the following descriptions.

According to one aspect of the present invention, a method for manufacturing a semiconductor device is characterized by comprising the steps of:

forming an amorphous silicon film on a substrate having an insulating surface;

patterning said amorphous silicon film to form a predetermined pattern;

holding a metal element that accelerates the crystallization of silicon in such a manner that said metal element is brought into contact with said amorphous silicon film;

performing a heating process to crystallize said amorphous silicon film, thereby being converted into a crystalline silicon film; and etching a peripheral portion of the pattern of said crystalline silicon film.

According to another aspect of the present invention, a method for manufacturing a semiconductor device is characterized by comprising the steps of:

forming a region into which a defect and/or stress is concentrated in a preselected region of an amorphous silicon film;

holding a metal element that accelerates the crystallization of silicon in such a manner that said metal element is brought into contact with said amorphous silicon film;

performing a heating process so as to crystallize said amorphous silicon film; and etching said preselected region.

According to a further aspect of the present invention, a method for manufacturing a semiconductor device is characterized by comprising the steps of:

forming a region into which a defect and/or stress is concentrated in a preselected region of an amorphous silicon film;

holding a metal element that accelerates the crystallization of silicon in such a manner that said metal element is in contact with said amorphous silicon film;

performing a heating process so as to crystallize said amorphous silicon film and, at the same time, segregating said metal element into said preselected region; and etching said preselected region.

In each of the above-described manufacturing methods according to the present invention, generally speaking, when a glass substrate is utilized, the temperature of the heating process is preferably selected to be 450° C. to 700° C.

When a quartz substrate is used as the substrate, the temperature of the heating process is preferably selected to be 800° C. to 1100° C. In particular, since such a high temperature is selected, it is preferable to obtain the high crystallinity.

In accordance with the present invention, examples of metal element that accelerates the crystallization of silicon, one or plural sorts of metal elements selected from Fe, Co, Ni, Ru, Rh, Pd, Os, Ir, Pt, Cu, and Au may be used.

As a method for introducing this metal element, it is preferable to use a solution containing the metal element. Since the metal element can be formed in the film shape according to this method using the solution, there is a merit that this metal element can be held in such a manner that this metal element is uniformly brought into contact with the surface of the amorphous silicon film.

The present invention also possesses such a particular feature that the concentration of the metal element can be easily controlled. In general, the concentration of the metal element that accelerates the crystallization of silicon should be reduced as low as possible. As a consequence, it is a very important technique to control an amount of a metal element to be introduced.

A description will now be made of the method using the metal element solution. First, when Ni is used as the metal element that accelerates the crystallization of silicon, it is possible to use at least one sort of solution selected from such nickel compounds as nickel bromide, nickel acetate, nickel oxalate, nickel carbonate, nickel chloride, nickel iodide, nickel nitrate, nickel sulfate, nickel formate, nickel acetyl acetate, 4-cyclohexyl butyric nickel, nickel oxide, nickel hydroxide, and 2-ethylhexane nickel.

Also, Ni may be contained in a non-polarity solution selected from at least one of benzene, toluene, xylene, carbon tetrachloride, chloroform, ether, trichloroethylene, and Freon.

In the case that Fe (iron) is used as the metal element that accelerates the crystallization of silicon, various materials known as iron salt may be selected from, for instance, iron (I) bromide ($FeBr_2 6H_2O$), iron (II) bromide ($FeBr_3 6H_2O$), ferric acetate ($Fe(C_2H_3O_2)_{3x}H_2O$), ferrous chloride ($FeCl_2 4H_2O$), ferric chloride ($FeCl_3 6H_2O$), ferric fluoride ($FeF_3 3H_2O$), ferric nitrate ($Fe(NO_3)_3 9H_2O$), ferrous phosphate ($Fe_3PO_4 8H_2O$), and ferric phosphate ($FePO_4 2H_2O$).

In such a case that Co (cobalt) is used as the metal element that accelerates the crystallization of silicon, various materials known as cobalt salt functioning as a cobalt compound may be selected from, for instance, cobalt bromide ($CoBr6H_2O$), cobalt acetate ($CoF_{2x}H_2O$), cobalt chloride ($CoCl_2 6H_2O$), cobalt fluoride ($CoF_{2x}H_2O$), and cobalt nitrate ($Co(No3)26H2O$).

When Ru (ruthenium) is used as the metal element that accelerates the crystallization of silicon, various materials known as ruthenium salt functioning as a ruthenium compound may be selected from, for example, ruthenium chloride ($RuCl_3 H_2O$).

When Rh (rhodium) is used as the metal element that accelerates the crystallization of silicon, various materials known as rhodium salt functioning as a rhodium compound, for instance, rhodium chloride ($Rhcl_3 3H_2O$) may be used.

When Pd (palladium) is used as the metal element that accelerates the crystallization of silicon, various materials known as palladium salt functioning as a palladium compound, for instance, palladium chloride ($Pdcl_2 2H_2O$) may be used.

When Os (osmium) is used as the metal element that accelerates the crystallization of silicon, various materials known as osmium salt functioning as a osmium compound, for instance, osmium chloride ($Oscl_3$) may be used.

When Ir (iridium) is used as the metal element that accelerates the crystallization of silicon, various materials known as iridium salt functioning as a iridium compound, for instance, iridium trichloride ($IrCl_3 3H_2O$) and iridium tetrachloride ($IrCl_4$) may be used.

When Pt (platinum) is used as the metal element that accelerates the crystallization of silicon, various materials known as platinum salt functioning as a platinum compound, for instance, platinum (II) chloride ($PtCl_4 5H_2O$) may be used.

When Cu (copper) is used as the metal element that accelerates the crystallization of silicon, various materials as a copper compound, for instance, copper (II) acetate ($Cu(CH_3COO)_2$), copper (II) chloride ($CuCl_2 2H_2O$), and copper (II) nitrate ($Cu(NO_3)_2 3H_2O$) may be used.

When Au (gold) is used as the metal element that accelerates the crystallization of silicon, various materials as a gold compound, for instance, gold trichloride ($AuCl_{3x}H_2O$) and gold chloride salt ($AuHCl_4 4H_2O$) may be used.

Figure 6:
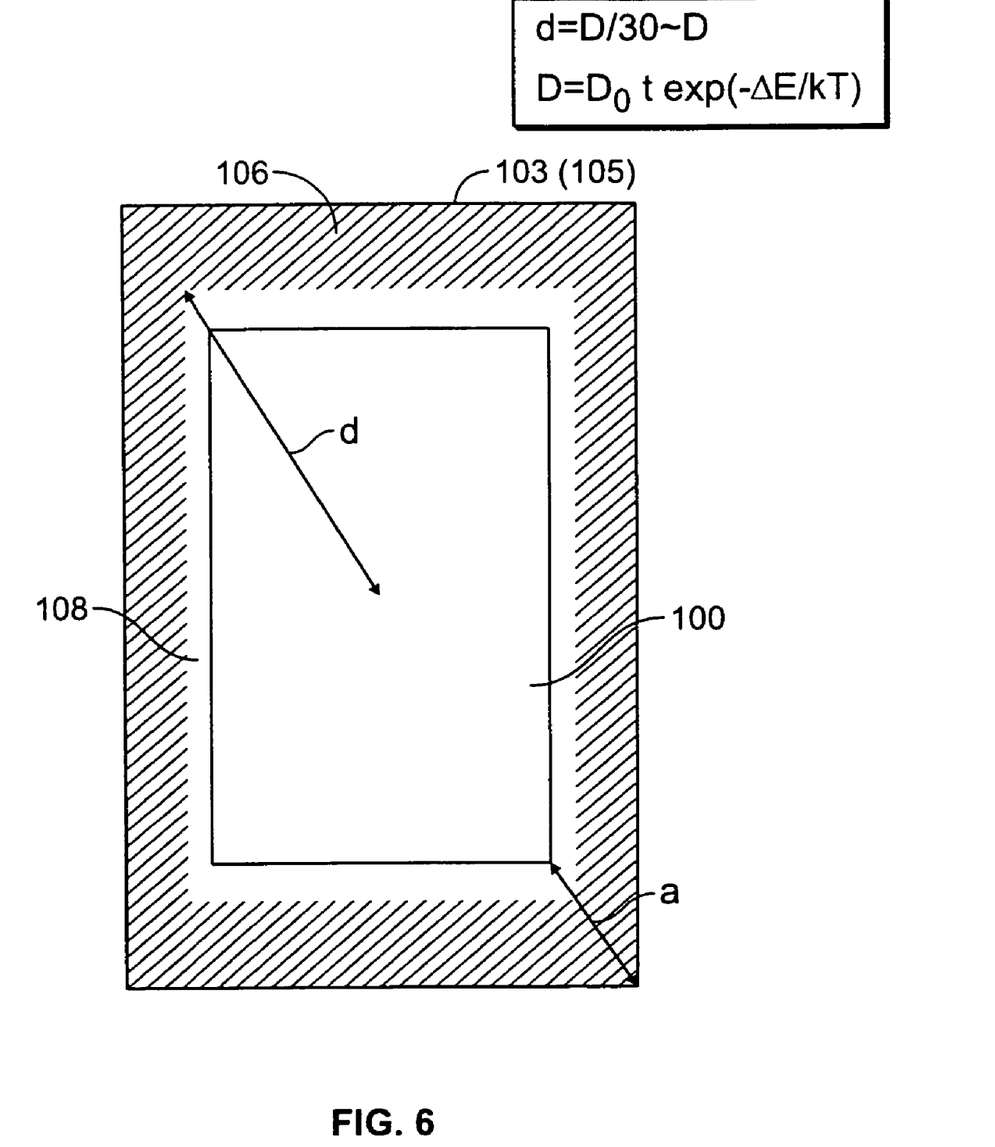
FIG. 6 is a top view for representing a patterning condition of the crystalline silicon film.

As represented in FIG. 6, for example, a peripheral portion 108 of a pattern 100 of a crystalline silicon film to be obtained is removed. In this region 108, stress distortion and defects, which are formed when the pattern 103 is obtained, are concentrated to a peripheral portion 106. Then, the metal element that accelerates the crystallization of silicon is present with high concentration within this region 106. As a consequence, it is possible to obtain a crystalline silicon film 100 from which the adverse influence caused by this metal element has been eliminated by removing this region 106.

In such a case that a region into which defects and stress are artificially concentrated is formed, a diffusion distance "D", of the metal element will now be considered. Concretely speaking, since another distance "d" defined from a central portion of an eventually obtained pattern to the region into which the defects and the stress are concentrated is selected to be d=D/30 to D, the metal element can be effectively and forcibly moved to such a region into which the above-explained defects and stress are concentrated. More specifically, the above-explained metal element can be removed from the channel forming region of the thin-film transistor, so that such a thin-film transistor operable under stable condition can be manufactured.

As described above, since the region into which the defects and stress are concentrated is used as the gettering region of the metal element that accelerates the crystallization of silicon, the reliability of the semiconductor device using the crystalline silicon film can be improved.

BRIEF DESCRIPTION OF THE DRAWINGS

For a better understanding of the present invention, reference is made of the following detailed description to be read in conjunction with the accompanying drawings, in which.

DETAILED DESCRIPTION OF THE PREFERRED EMBODIMENTS

Referring now to drawings, various embodiments of the present invention will be described.

Embodiment 1

It should be noted that as a metal element that accelerates the crystallization of silicon, the below-mentioned embodiments mainly use nickel. This is because the highest advantages could be achieved in the embodiments when nickel is used. Also, as other preferable metal elements except for nickel, there are palladium, platinum, and copper. When these preferable metal elements are used, a similar effect to that of nickel may be obtained.

FIG. 1 schematically represents a manufacturing step of a thin-film transistor according to an embodiment 1 of the present invention. First, a silicon oxide film 102 having a thickness of 3000 Å is formed as an underlayer film on a glass substrate 101 by either a plasma CVD method or a sputtering method. This silicon oxide film 102 owns such a function to block a diffusion of an impurity from the glass substrate 101. Also, this silicon oxide film 102 has another function to relax the stress produced between the glass substrate 101 and a silicon thin-film which will be formed in a later step.

Next, an amorphous silicon film (not shown) having a thickness of 500 Å is formed on the silicon oxide film 102 by a plasma CVD method. Next, an island-shaped pattern 103 made of an amorphous silicon film is formed by patterning a pattern larger than an active layer of a finally manufactured thin-film transistor (see FIG. 1A).

As for a plasma CVD film having a thickness of 500 Å used in this embodiment 1, a recognition could be made in that the maximum diffusion distance of the nickel element under plasma CVD method of 550° C. and 4 hours is approximately 2 μm. As a consequence, a distance "d" shown in FIG. 6 is selected to be 2 μm, and FIG. 6 represents a condition under which the thin-film transistor of FIG. 1 is viewed from the upper surface. It should be noted that a distance indicated by "a" is selected to be 0.5 μm.

It is desirable to form this pattern by a plasma etching process having vertical anisotropy. This is because when a plasma etching treatment is carried out, the stress distortion and defects caused by the plasma damages would be readily produced in the edge regions of the island-shaped pattern.

Figure 1A:
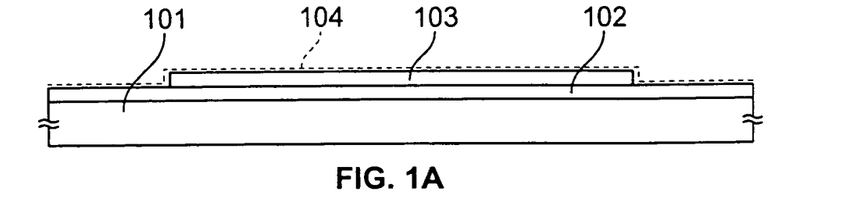
FIGS. 1A-1E schematically show a manufacturing process of a thin-film transistor according to an embodiment of the present invention.

Then, a nickel acetate solution whose concentration has been controlled to a predetermined value is coated by a spin coat method in order that the nickel element 104 is held in contact with an exposed surface of the island-shaped pattern 103 made of the amorphous silicon film (see FIG. 1A).

Under this condition, the heating process at 600° C. is performed for 4 hours. The temperature of this heating process is desirably selected to be higher temperatures in the temperature range where the glass substrate 101 can endure the higher temperatures. As a result, when the quartz substrate is used, the heating temperature is preferably selected to be from 800° C. to 1100° C. for the crystallization purpose.

Figure 1B:
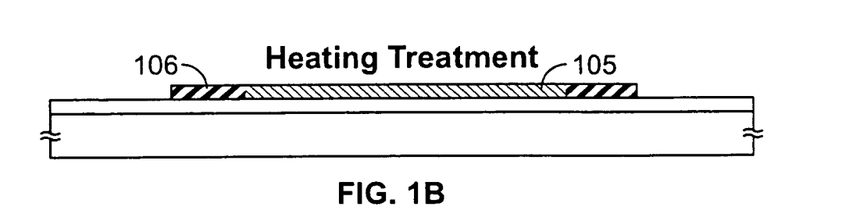

The island-shaped pattern 103 of the amorphous silicon film is crystallized by performing this heating process. At this time, the nickel element disperses to the peripheral portion of the pattern 103 and concentrates thereto. This concentration to the peripheral portion of the pattern 103 is emphasized in connection with the temperature increase of the heating process.

In accordance with the diffusion of this nickel element, crystallization of the amorphous silicon film is advanced, so that the pattern 103 is converted into a crystalline silicon film 105.

Also, at this time, the nickel element is concentrated to an edge region of the pattern into which the plasma damage and the stress distortion are concentrated (see FIG. 1B).

Next, an exposed region of 108 is removed by an etching process by using a resist mask 107. In other words, the region into which the nickel element is concentrated is removed by a etching treatment. An active layer 100 of a thin-film transistor is accomplished by this etching step (see FIG. 1C).

Now, as shown in FIG. 6, in the region of 108 to be removed, a dimension indicated as "a" is selected to be 20 μm. In this embodiment, a dimension indicated by "d" is selected to be 20 μm, and then a rectangular pattern defined by 15 μm to 30 μm is obtained as indicated in this drawing. This rectangular pattern 100 becomes an active layer for constituting the thin-film transistor.

Since the region 106 into which the nickel element has been concentrated is present in the region 108 to be removed in the structure of this embodiment, such a condition can be eventually realized under which substantially no lump of the nickel element is present in the active layer indicated by 100.

Furthermore, an aluminum film containing scandium at 0.2 wt % is formed by a sputtering method or an electron beam vapor deposition method. The reason why scandium is contained in the aluminum film is to suppress an occurrence of "hillock" (prickle-shaped projection, or needle-shaped projection) caused by the unusual growth of aluminum in the succeeding step.

Then, this aluminum film is patterned to thereby form a gate electrode 111. Next, the anode oxidation is carried out in the electrolytic solution by using the gate electrode 111 as the anode, so that an anode oxide film 112 is formed. A thickness of this anode oxide film 112 is selected to be 500 Å. The formation of this anode oxide film 112 can provide such a great advantage that the occurrence of "hillock" is suppressed. Also, when the thickness of this anode oxide film 112 is made thick, an offset gate region may be formed in a succeeding step to implant an impurity ion (see FIG. 1D).

Figure 1C:
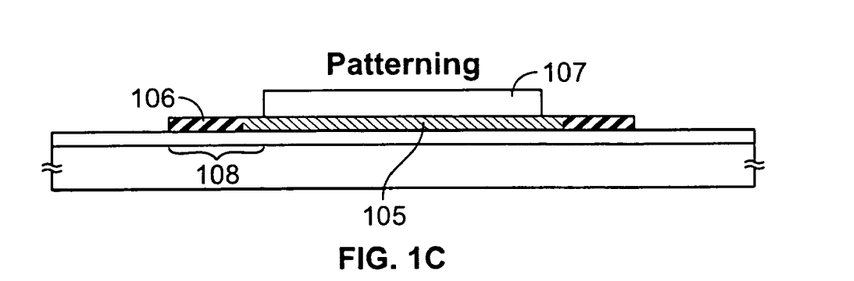
Figure 1D:
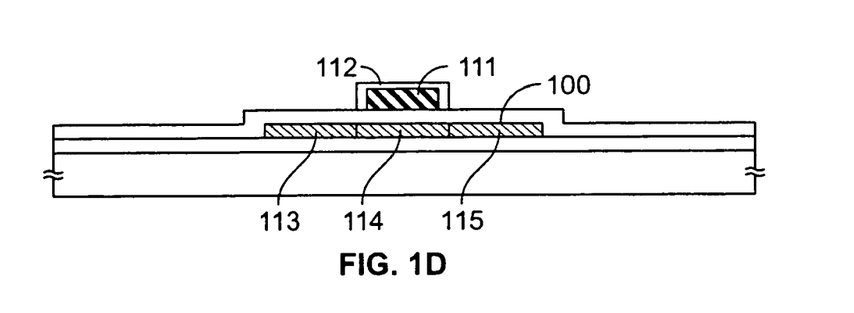

When the semiconductor under condition of FIG. 1D is obtained, a P (phosphorus) ion is implanted by a plasma doping method. In this manufacturing step, the gate electrode 111 may constitute the mask, so that a source region 113, a channel forming region 114, and a drain region 115 are formed in the self-alignment manner (see FIG. 1D).

In this example, the N-channel type thin-film transistor is manufactured by an implantation of P ion. However, when a B ion is implanted, a P-channel type thin-film transistor may be alternatively manufactured.

Figure 1E:
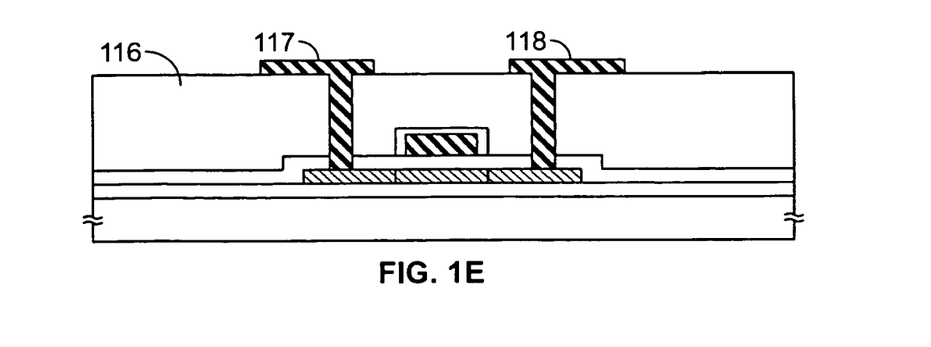

Next, a silicon oxide film 116 is formed as an interlayer insulating film with a thickness of 7000 Å by a plasma CVD method. Furthermore, a contact hole is formed, and both a source electrode 117 and a drain electrode 118 are formed by a stacked layer film of a titanium film, an aluminum film, and a titanium film. In this manner, a thin-film transistor as shown in FIG. 1E may be accomplished.

When the above-described manufacturing steps of this embodiment 1 are used, it is possible to suppress such a fact that the region to which the nickel element is concentrated is formed in the active layer 100. As a consequence, the difficulties caused by the presence of the nickel element can be avoided.

Embodiment 2

This embodiment 2 is related to an arrangement for obtaining a thin-film transistor having a higher crystallinity than that of the embodiment 1 by combining the manufacturing steps shown in the embodiment 1 with irradiation of laser light.

In FIGS. 4A-4E, there is shown a manufacturing step according to this embodiment 2.

Figure 4A:
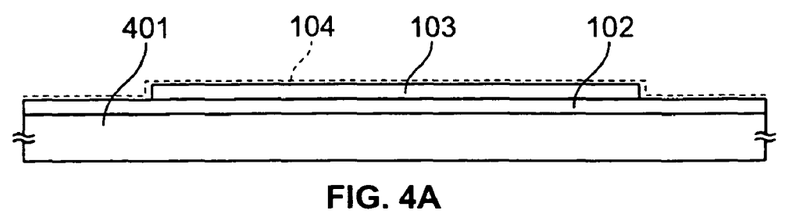
FIGS. 4A-4E schematically indicate a manufacturing step of a thin-film transistor according to another embodiment of the present invention.
Figure 4B:
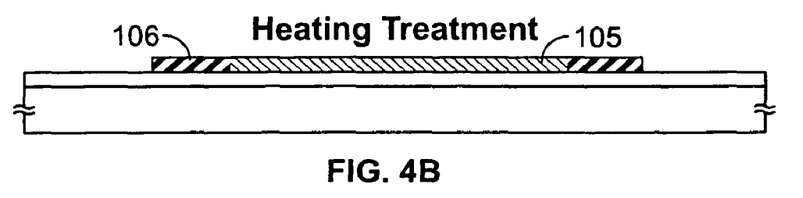
Figure 4C:
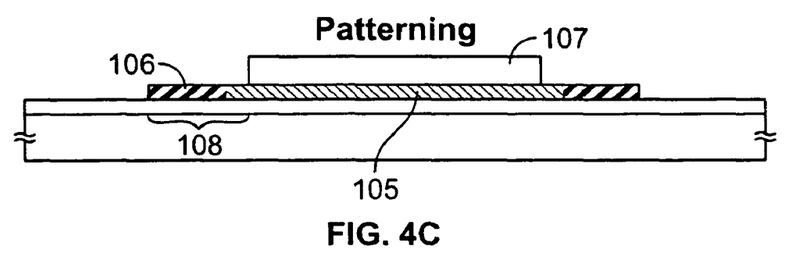

Similar to the manufacturing steps indicated in FIG. 1, a silicon oxide film 102 is formed as an underlayer film on a quartz substrate 401. In this embodiment, the silicon oxide film 102 having a thickness of 5000 Å is formed in order to buffer, or relax stress executed between the quartz substrate and a silicon film which will be formed later.

Next, an amorphous silicon film having a thickness of 1000 Å is formed by a low pressure thermal CVD method. Subsequently, this amorphous silicon film is patterned to thereby form an island-like pattern 103 (see FIG. 4A).

Then, a nickel acetate solution is coated by a spin coat method, and as indicated by reference numeral 104, the nickel element held under such a condition that this nickel element is brought into contact with the surface of the island-like pattern 103 made of the amorphous silicon film in a film shape (see FIG. 4A).

Thereafter, the heating process is carried out at 850° C. for 4 hours, so that the island-like pattern 103 made of the amorphous silicon film is converted into a crystalline silicon film. In this step, since the heating temperature is high, the nickel element is highly concentrated into the peripheral portion of the pattern (see FIG. 4B).

As a result, a crystalline silicon film 105 and also a region 106 where the nickel element is concentrated can be obtained. Then, the peripheral portion 106 of the pattern is removed by an etching process using the resist mask 107. At this step, such a region where the nickel element is present in the concentrated manner is selectively removed (see FIG. 4C).

Then, a crystalline silicon film 402 having an island-like pattern for constituting an active layer of a thin-film transistor is obtained by removing the resist mask 107. The region indicated by this reference numeral 402 corresponds to a region indicated by reference numeral 109 of FIG. 4B.

Figure 4D:
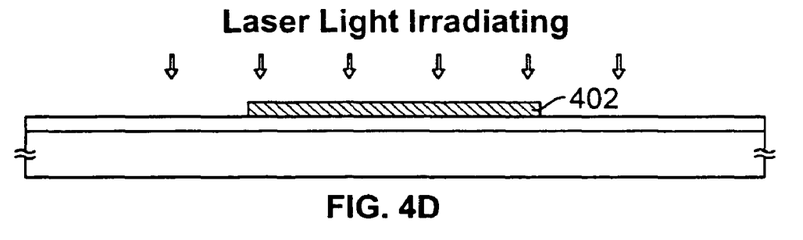
Figure 4E:
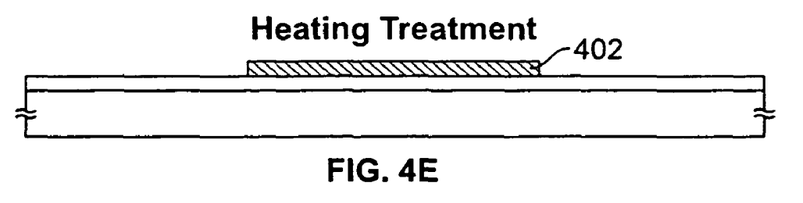

Subsequently, as represented in FIG. 4D, laser light is irradiated to the resultant semiconductor device. The crystallinity of the crystalline silicon film 402 having the island-like pattern can be improved by a laser irradiation.

Also, in accordance with this embodiment 2, after the laser light irradiation, the heating process is carried out at 800° C. for 2 hours. The defects occurred irradiating this laser light in the film can be reduced by this heating process (see FIG. 4E).

It should be understood that such a crystalline silicon film having sufficiently high crystallinity may be obtained, even if this second heating process is not carried out. As a result, when the overall manufacturing state is wanted to be simplified, this second heating step may be omitted.

After the active layer 402 made of the crystalline silicon film has been obtained in this manner, a thin-film transistor using the active layer 402 is fabricated in accordance with the steps described in Embodiment 1.

Embodiment 3

This embodiment 3 relates to such a structure that a heating process is carried out instead of the laser light irradiation in the manufacturing steps shown in FIG. 4D. FIGS. 5A-5D show manufacturing steps of this embodiment. First, a silicon oxide film 102 having a thickness of 5000 Å is formed as an underlayer film on a quartz substrate 401 by a plasma CVD method. Next, an amorphous silicon film (not shown) having a thickness of 1000 Å is formed by a low pressure thermal CVD method.

Figure 5A:
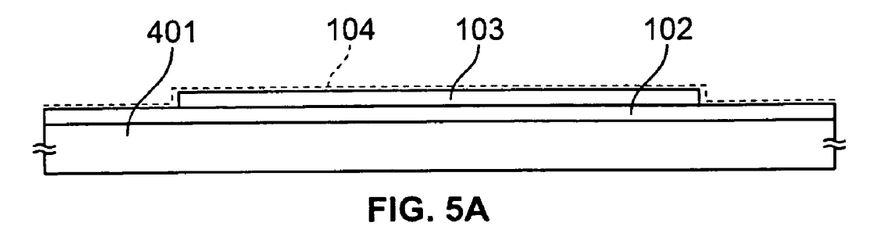
FIGS. 5A-5D schematically indicates a manufacturing step of a thin-film transistor according to another embodiment of the present invention.
Figure 5B:
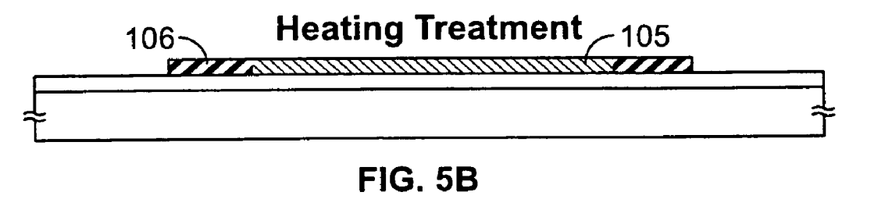

Next, this amorphous silicon film is patterned to thereby form an island-like pattern 103 as indicated in FIG. 5A. Furthermore, a nickel acetate solution is coated by a spin coat method, and a nickel element is provided in a film shape as indicated by reference numeral 104 (see FIG. 5A).

Then, a heating process is executed at 850° C. for 4 hours, so that a crystalline silicon film 105 is formed. Under this state, the nickel element is concentrated around this crystalline silicon film 105 (see FIG. 5B).

Figure 5C:
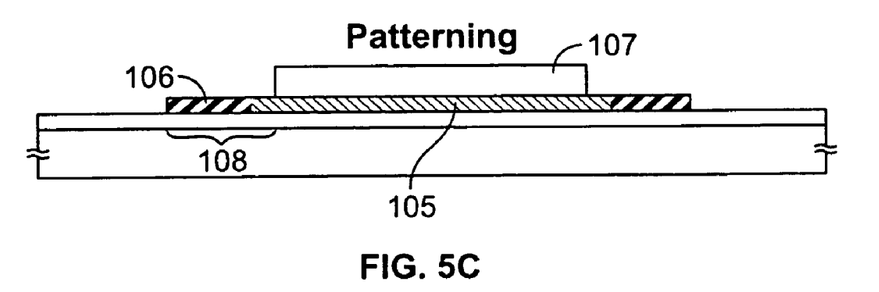

Next, a resist mask 107 is arranged to etch away a region indicated by reference numeral 108 in FIG. 5C. In this case, the region 105 is slightly etched away for a small margin.

Figure 5D:
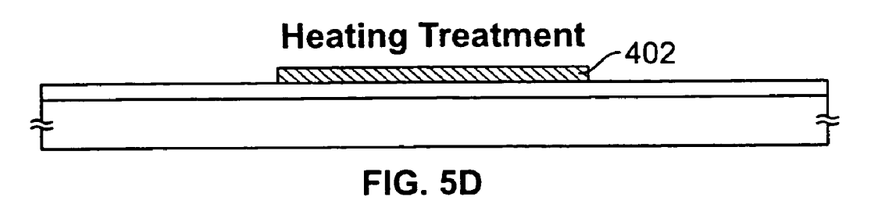

As described above, the island-like pattern 102 made of the crystalline silicon film is obtained, as illustrated in FIG. 5D. It should be noted that this pattern 402 will constitute an active layer of a thin-film transistor in a later step.

According to this embodiment, the heating process is again carried out under such a state as shown in FIG. 5D, thus, the crystallinity of the island-like pattern 110 can be furthermore improved by performing this second heating process. It should be noted that laser light or intense light may be irradiated after this second heating process is performed.

Embodiment 4

Figure 7:
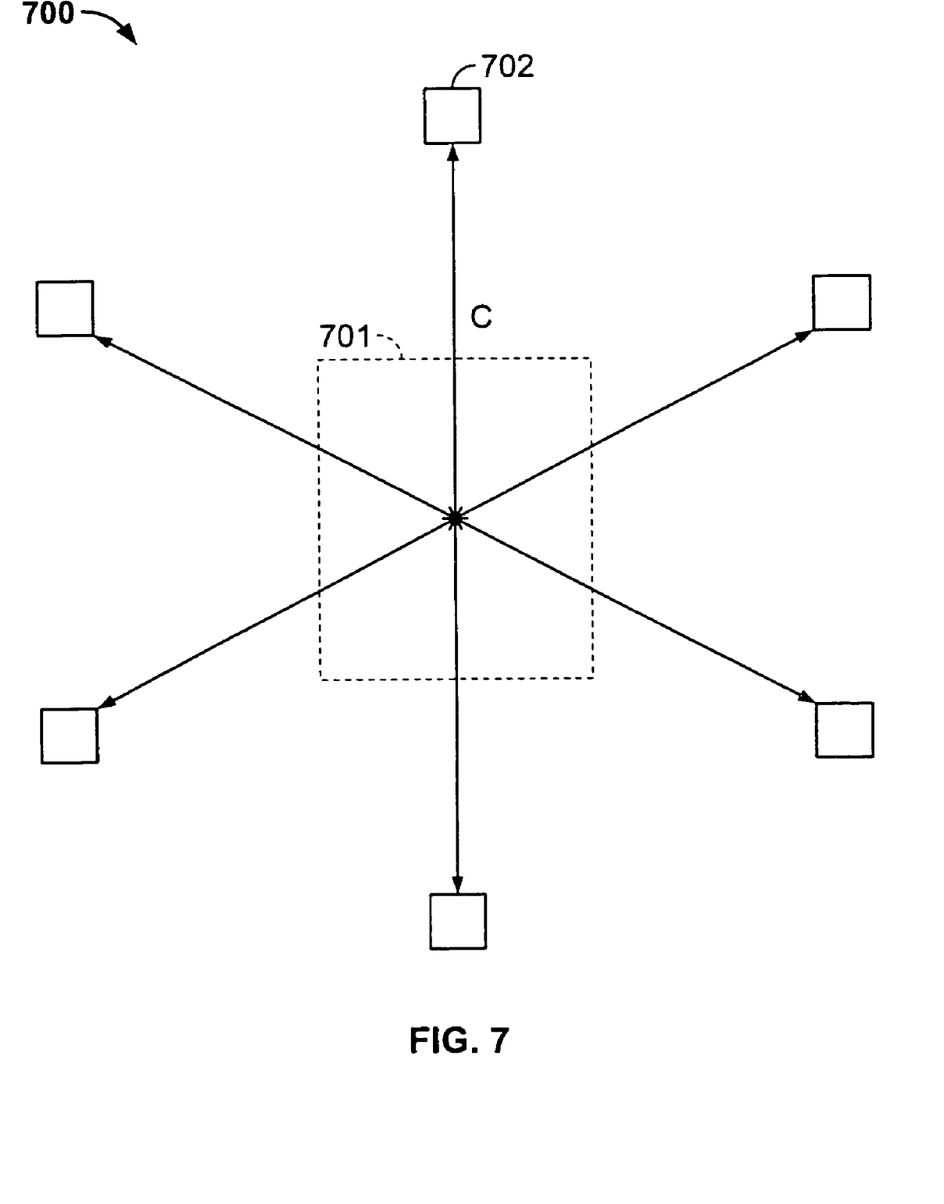
FIG. 7 is a top view for indicating a patterning condition of a crystalline silicon film manufactured by the present invention.

Referring now to FIG. 7, a manufacturing method of an embodiment 4 will be explained. This embodiment 4 is featured as follows. A plurality of openings are formed in an amorphous silicon film around a region 701 which will finally constitute an active layer of a thin-film transistor. A metal element that accelerates the crystallization of silicon is segregated in the region where the opening is formed.

To execute this embodiment 4, an amorphous silicon film 700 is formed on a substrate having a proper insulating surface by a plasma CVD method, or a low pressure thermal CVD method. Next, a portion of the amorphous silicon film is etched away, as represented by reference numeral 702, so as to form openings. It should be understood that the shape of the openings may not be limited to a rectangular shape, but may be a circular shape or a slit shape.

In this embodiment, nickel is used as the metal element that accelerates the crystallization of silicon. After the above-described opening has been formed, a nickel acetate solution whose concentration is controlled to a predetermined value is coated, and the nickel element is brought into contact with the amorphous silicon film 700 in a film shape to be held.

Then, the heating process is carried out, so that the amorphous silicon film 700 is crystallized. At this time, the nickel element is concentrated to an opening portion indicated by reference numeral 702. This concentration of nickel elements caused by such a reason that defects and stress distortion are concentrated to the region of the opening 702.

The structure as illustrated in this embodiment 4 may become effective in the case that a diffusion distance of a metal element is long, and further a dimension of a pattern is small. For example, this structure of the embodiment 4 becomes effective when a very fine integrated circuit is constituted by using a quartz substrate.

In FIG. 7, also a distance indicated as "c" must satisfy the following condition:

c=D/30 to D, $D=D_0 t \exp(-\Delta E/kt)$.

It should be understood that, generally speaking, the diffusion distance of the metal element indicated by "D" may be actually measured for the sake of simplicity.

In this condition, symbol "D" is a maximum diffusion distance, whereas a minimum diffusion distance is substantially one out of several tens of this maximum diffusion distance. If the distance indicated by the above symbol "c" is made shorter than this minimum diffusion distance, it is possible to make up an arrangement from which the nickel element is completely removed. Concretely speaking, when the value of "c" is selected to be shorter than, or equal to 5 μm, the nickel concentration can be made very low. The above-explained value of "D" may become greatly different from each other, depending upon the film forming conditions of the starting films, the film forming methods thereof, and further the heating methods thereof. The typical value of "D" is 1 μm to 5 μm. As a result, the value of "d" is selected to be smaller than, or equal to 2 μm, preferably smaller than, or equal to 1 μm.

Embodiment 5

FIGS. 8A-8D schematically show manufacturing steps according to an embodiment 5 of the present invention. In this manufacturing step shown in FIG. 8, a quartz substrate is used as a substrate. A silicon oxide film 802 having a thickness of 5000 Å is firstly fabricated as an underlayer film on the quartz substrate by a plasma CVD method. Next, an amorphous silicon film (not shown) having a thickness of 7000 Å is formed. Then, this amorphous silicon film is patterned to thereby form a pattern as indicated by reference numeral 803 of FIG. 8A.

Figure 8A:
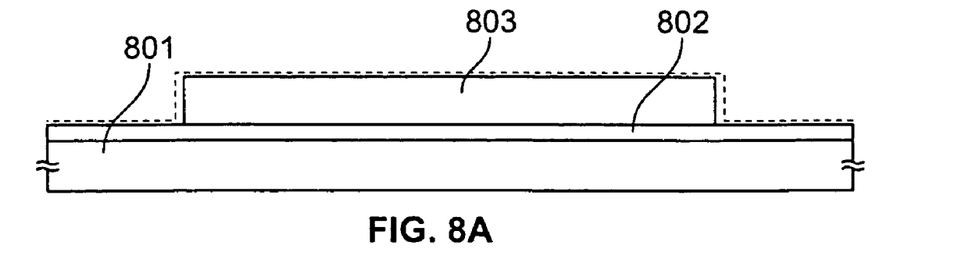
FIGS. 8A-8D schematically indicate a manufacturing step of a thin-film transistor according to a further embodiment of the present invention.

Subsequently, a nickel acetate solution whose concentration is controlled to a preselected value is coated, and then a nickel element is formed in such a manner that this nickel element is made in a film shape as indicated by reference numeral 803 (see FIG. 8A).

Figure 8B:
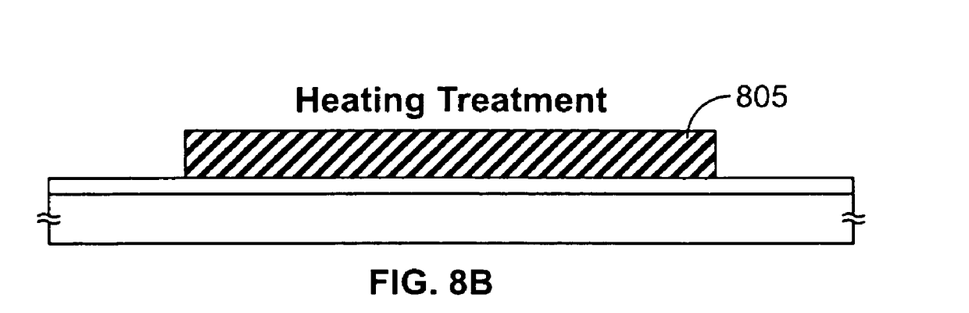
Figure 8C:
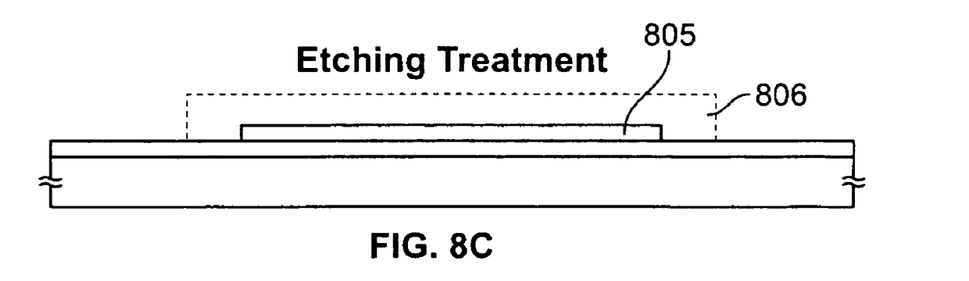
Figure 8D:
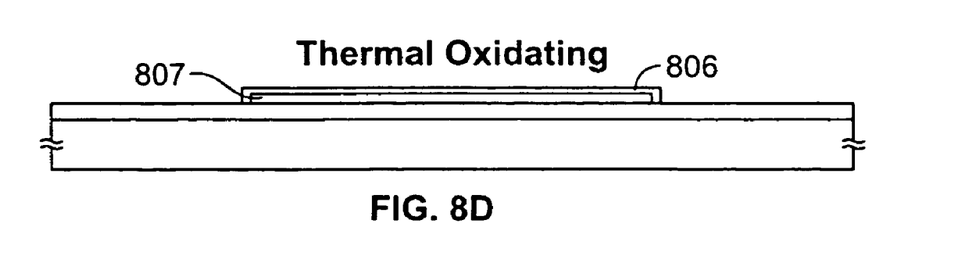

Next, the heating process is performed at 950° C. for 4 hours so as to obtain a crystalline silicon film 804.

Thereafter, a surface of a crystalline silicon film having an island-shape indicated by reference numeral 805 is etched by using the isotropic etching means. In this step, a crystalline silicon film 806 having a thickness of 1500 Å is obtained (see FIG. 8C).

Subsequently, the thermal oxidation is carried out at 850° C. so that a thermal oxidation film having a thickness of 500 Å is formed on an exposed surface of the island-like crystalline silicon film 806. In this manner, an active layer 806 made of the crystalline silicon film is obtained which can be utilized in a thin-film transistor (see FIG. 8D).

Embodiment 6

This embodiment 6 is related to such a structure capable of further emphasizing the eliminating effect of the metal element that accelerates the crystallization of silicon. In FIGS. 9A-9D, there are shown manufacturing steps according to this embodiment 6. First, a silicon oxide film 902 having a thickness of 3000 Å is formed as an underlayer film on a glass substrate 901.

Next, an amorphous silicon film having a thickness of 500 Å is formed by a plasma CVD method. Furthermore, this amorphous silicon film is patterned to thereby form an island-like region indicated by reference numeral 903. Then, a nickel acetate solution whose concentration is controlled to a predetermined value is coated by a spin coat method, and a nickel element is provided in a film shape as indicated by reference numeral 904 (see FIG. 9A).

Subsequently, a resist mask 905 is positioned so as to implant a P (phosphorous) ion. In this manufacturing step, the P ion is implanted into a region denoted by reference numeral 906. Defects are formed in the region denoted by reference numeral 906 in higher density by performing the implantation of P ion. Also, no P ion is implanted into another region denoted by reference numeral 907 (see FIG. 9B).

Figure 9A:
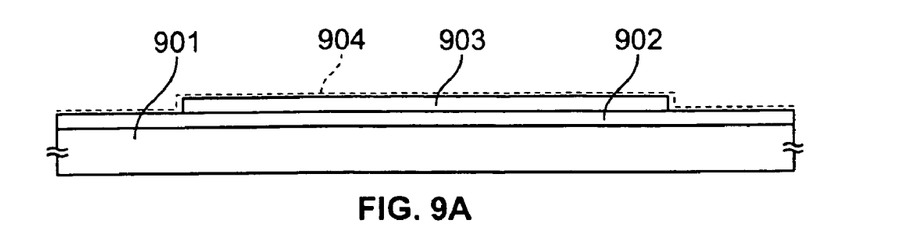
FIGS. 9A-9D schematically indicate a manufacturing step of a thin-film transistor according to a still further embodiment of the present invention.
Figure 9B:
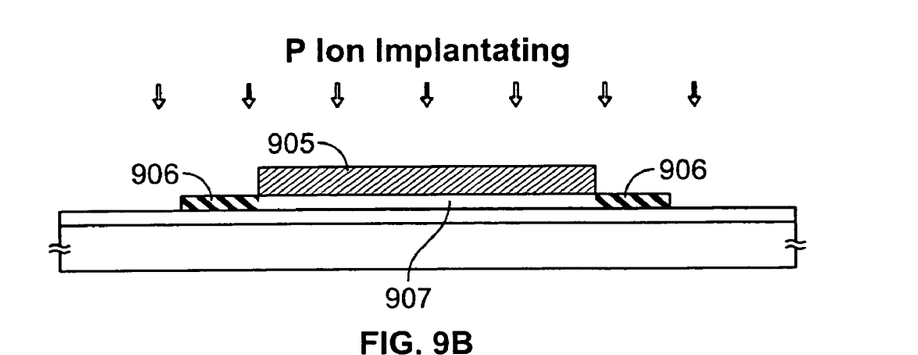

Next, the resist mask 905 is removed to thereby perform the heating process at 550° C. for 4 hours. In this step, the overall amorphous silicon film is crystallized. At this time, the nickel element is concentrated to a region denoted by reference numeral 906 and located at an edge peripheral portion of the pattern, indicated by reference numeral 903. This concentration effect of the nickel element is caused by such a fact that P (phosphorous) having the gettering effect of the metal element is implanted into the region 906, and further, the defects are formed in the region 906 at higher density by an implantation of P ion.

Figure 9C:
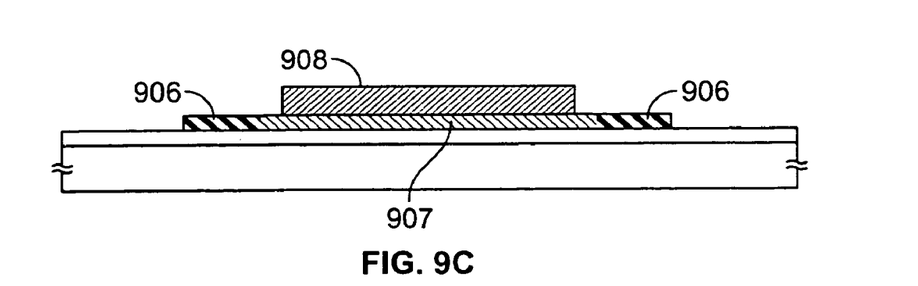
Figure 9D:
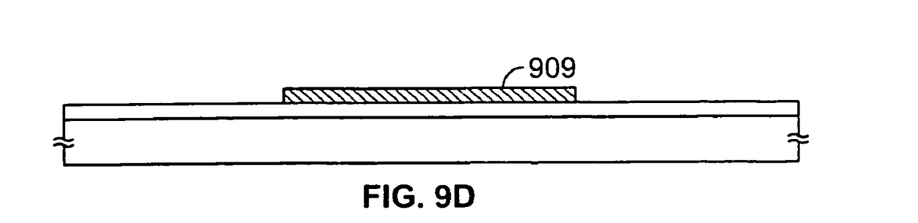

Thereafter, as indicated in FIG. 9C, another resist mask 908 is newly arranged in order to etch away the exposed region of the silicon film. Thus, it is possible to obtain a region 909 made of the island-like crystalline silicon film from which the nickel element has been removed. It should be noted that although the phosphorous ion is used in the above-described manufacturing step, an oxygen ion may be used. Alternatively, it is possible to use ions of inert elements with respect to the semiconductor material, for example, silicon ions or argon ions.

As previously described in detail, according to the present invention, it is possible to form the pattern of the crystalline silicon film having a small portion, or no portion into which the metal element has been concentrated in the following manner. That is, the previously patterned amorphous silicon film is crystallized by a heating process, while using the metal element that accelerates the crystallization of silicon. Furthermore, the peripheral region of the pattern, into which this metal element is concentrated, is removed.

In other words, as to the technique for obtaining the crystalline silicon film by using the metal element that accelerates the crystallization of silicon, such a novel technique is proposed, which can avoid that the metal element is locally concentrated.

As a consequence, characteristics of thin-film transistors can be improved by utilizing the techniques as disclosed in this specification Also, the manufacturing yield of the obtained thin-film transistor can be increased. Moreover, the characteristics of the obtained thin-film transistor can be made stable.

What is claimed is:

1. A method for manufacturing a semiconductor device comprising:
    forming a non-single crystalline semiconductor film over a substrate having an insulating surface;
    patterning the semiconductor film into a patterned semiconductor film by first etching;
    disposing a crystallization promoting material in contact with the patterned semiconductor film either before or after the patterning, the crystallization promoting material containing a metal;
    crystallizing the patterned semiconductor film provided with the crystallization promoting material by heating, wherein the metal segregates in an edge portion of the patterned semiconductor film during the crystallization; and
    removing the edge portion of the patterned semiconductor film by second etching after the crystallizing step to form an active region of the semiconductor device.

2. The method according to claim 1, wherein the non-single crystalline semiconductor film is amorphous.

3. The method according to claim 1, wherein the heating is carried out at 450-700° C.

4. The method according to claim 1, wherein the heating is carried out at 800-1100° C. and the substrate is a quartz substrate.

5. The method according to claim 1, wherein the semiconductor film comprises silicon.

6. A method for manufacturing a semiconductor device comprising:
    forming a non-single crystalline semiconductor film over a substrate having an insulating surface;
    patterning the semiconductor film to provide defects and stress in an edge portion of the semiconductor film by first etching;
    applying a solution comprising a crystallization promoting material in contact with the semiconductor film, the crystallization promoting material containing a metal;
    crystallizing the patterned semiconductor film applied with the crystallization promoting material by heating wherein the metal segregates in the edge portion during the crystallization; and
    patterning the edge portion by second etching after the crystallizing step to form an active region of the semiconductor device.

7. The method according to claim 6, wherein the non-single crystalline semiconductor film is amorphous.

8. The method according to claim 6, wherein the heating is carried out at 450-700° C.

9. The method according to claim 6, wherein the heating is carried out at 800-1100° C. and the substrate is a quartz substrate.

10. The method according to claim 6, wherein the defects and/or stress are provided by directing ions of phosphorous or oxygen into the selected region.

11. The method according to claim 6, wherein the semiconductor film comprises silicon.

12. A method for manufacturing a semiconductor device comprising:
    forming a non-single crystalline semiconductor film over a substrate having an insulating surface;
    patterning the semiconductor film to provide defects and stress in an edge portion of the semiconductor film by first etching;
    disposing a crystallization promoting material in contact with the semiconductor film, the crystallization promoting material containing a metal;
    crystallizing the patterned semiconductor film provided with the crystallization promoting material by heating wherein the metal segregates in the edge portion during the crystallization; and
    removing at least the edge portion to form an active region of the semiconductor device by second etching after the crystallization.

13. The method according to claim 12, wherein the non-single crystalline semiconductor film is amorphous.

14. The method according to claim 12, wherein the heating is carried out at 450-700° C.

15. The method according to claim 12, wherein the heating is carried out at 800-1100° C. and the substrate is a quartz substrate.

16. The method according to claim 12, wherein the defects and/or stress are provided by directing ions of phosphorous or oxygen into the selected region.

17. The method according to claim 12, wherein a distance d between the selected region and a center of the active region is expressed by D/30 to D, where D is a dispersion distance of the metal.

18. The method according to claim 12, wherein the distance d is from 0.2 μm to 2 μm.

19. The method according to claim 12, wherein the D is expressed by $D_0 t \exp(-\Delta E/kt)$.

20. The method according to claim 12, wherein the semiconductor film comprises silicon.

21. A method of manufacturing a semiconductor device comprising:
    forming a non-single crystalline semiconductor film on an insulating surface;
    patterning the semiconductor film by first etching;

adding ions of an element which is inert to the semiconductor film into an edge portion thereof;

disposing a crystallization promoting material in contact with the semiconductor film, the crystallization promoting material containing a metal;

crystallizing the patterned semiconductor film by heating wherein the metal segregates in the edge portion during the crystallization; and removing at least the edge portion to form an active region of the semiconductor device by second etching.

22. The method according to claim 21, wherein the non-single crystalline semiconductor film is amorphous.

23. The method according to claim 21, wherein the heating is carried out at 450-700° C.

24. The method according to claim 21, wherein the heating is carried out at 800-1100° C. and the substrate is a quartz substrate.

25. The method according to claim 21, wherein the defects and/or stress are provided by directing ions of phosphorous or oxygen into the selected region.

26. The method according to claim 21, wherein the semiconductor film comprises silicon.

* * * * *